(12) United States Patent
Chuang

(10) Patent No.: US 11,502,041 B2
(45) Date of Patent: Nov. 15, 2022

(54) METHOD OF FORMING A PATTERN

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 28 days.

(21) Appl. No.: 16/855,998

(22) Filed: Apr. 22, 2020

(65) Prior Publication Data
US 2021/0335721 A1    Oct. 28, 2021

(51) Int. Cl.
| | |
|---|---|
| *H01L 23/544* | (2006.01) |
| *H01L 21/311* | (2006.01) |
| *G03F 1/42* | (2012.01) |
| *H01L 21/027* | (2006.01) |

(52) U.S. Cl.
CPC .............. *H01L 23/544* (2013.01); *G03F 1/42* (2013.01); *H01L 21/0274* (2013.01); *H01L 21/31111* (2013.01); *H01L 21/31144* (2013.01); *H01L 2223/54426* (2013.01)

(58) Field of Classification Search
CPC .............. H01L 23/544; H01L 21/0274; H01L 21/31111; H01L 21/31144; H01L 2223/54426; G03F 1/42
See application file for complete search history.

(56) References Cited

U.S. PATENT DOCUMENTS

| | | | |
|---|---|---|---|
| 2007/0138526 A1* | 6/2007 | Tran | H01L 21/3088 257/E21.235 |
| 2013/0210228 A1 | 8/2013 | Tran | |
| 2016/0005624 A1* | 1/2016 | Ryou | H01L 21/0337 438/671 |
| 2017/0179305 A1 | 6/2017 | Cheng et al. | |
| 2020/0117085 A1 | 4/2020 | Moon et al. | |

* cited by examiner

*Primary Examiner* — Monica D Harrison
*Assistant Examiner* — Andre C Stevenson
(74) *Attorney, Agent, or Firm* — CKC & Partners Co., LLC

(57) ABSTRACT

The present disclosure is related to a method of forming a pattern, including the steps of: providing a structure including a substrate and a target layer, in which the target layer is disposed on the substrate, and the target layer includes a central area and a periphery area; forming a plurality of core patterns and a linear spacer pattern on the central area, in which a width of the linear spacer pattern is wider than 50 nm; covering a photoresist on the periphery area; removing a portion of the central area not covered by the plurality of core patterns and not covered by the linear spacer pattern to form a pattern in the central area, and removing the photoresist, the linear spacer pattern and the plurality of core patterns to expose the pattern.

11 Claims, 6 Drawing Sheets

METHOD OF FORMING A PATTERN

BACKGROUND

Field of Invention

The present invention relates to a method of forming a pattern. More particularly, the present invention relates to a method of forming a pattern, which can avoid edge defects caused by optical proximity effect (OPE).

Description of Related Art

As the integration density of semiconductor devices increases, the lithographic process requires higher resolution to meet the accuracy requirements of the semiconductor devices. Photo-etching process is typically used to fabricate electronic and optoelectronic devices on a semiconductor substrate. Therefore, the accuracy of patterns is a very important factor in determining the quality of the semiconductor devices.

However, the edge defects such as the line-width bias, line-end shortening, line deficiency of patterns mainly caused by the photoresist overflowing out of the intended area remain after photo-etching process. Optical proximity correction (OPC), pre-distorting the patterns on the mask to minimize OPC, is usually performed for solving the edge defects. Yet, much time is needed for conducting OPC in the manufacture process.

A more efficient method for forming a pattern without edge defects is needed in the application.

SUMMARY

One aspect of the present disclosure is related to a method of forming a pattern, including the steps of: providing a structure including a substrate and a target layer, in which the target layer is disposed on the substrate, and the target layer includes a central area and a periphery area; forming a plurality of core patterns and a linear spacer pattern on the central area, in which the linear spacer pattern is spaced apart from the plurality of core patterns by a gap, in which a width of the linear spacer pattern is wider than 50 nm; covering a photoresist on the periphery area; removing a portion of the central area not covered by the plurality of core patterns and not covered by the linear spacer pattern to form a pattern in the central area, and removing the photoresist, the linear spacer pattern and the plurality of core patterns to expose the pattern.

In some embodiments, the structure further includes a hard mask between the substrate and the target layer.

In some embodiments, the target layer includes SiN.

In some embodiments, the width of the linear spacer pattern is from 50 nm to 150 nm.

In some embodiments, materials of the plurality of core patterns and the linear spacer pattern include oxides.

In some embodiments, the step of forming the plurality of core patterns and the linear spacer pattern on the central area includes performing a first litho-etch process, in which the first litho-etch process includes the following steps of: forming a first patterned photoresist on the mask layer; etching the mask layer not covered by the first patterned photoresist to form the plurality of core patterns and the linear spacer pattern on the central area; and removing the first patterned photoresist.

In some embodiments, the step of forming the plurality of core patterns and the linear spacer pattern on the central area includes forming a plurality of linear spacer patterns on the central area.

In some embodiments, the step of removing the portion of the central area not covered by the plurality of core patterns and not covered by the linear spacer pattern includes performing a second litho-etch process to form the pattern in the central area.

In some embodiments, the step of removing the photoresist, the linear spacer pattern and the plurality of core patterns includes performing an etching process to remove the linear spacer pattern and the plurality of core patterns.

In some embodiments, the pattern is an array pattern or an alignment mark.

Another aspect of the present disclosure is related to a method of forming an alignment mark, including the steps of: providing a structure including a substrate and a target layer, in which the target layer is disposed on the substrate, and the target layer includes a central area and a periphery area; forming a plurality of core patterns and a linear spacer pattern on the central area, in which the linear spacer pattern is spaced apart from the plurality of core patterns by a gap, in which a width of the linear spacer pattern is wider than 50 nm; covering a photoresist on the periphery area; removing a portion of the central area not covered by the plurality of core patterns and not covered by the linear spacer pattern to form an alignment mark in the central area, and removing the photoresist, the linear spacer pattern and the plurality of core patterns to expose the alignment mark.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
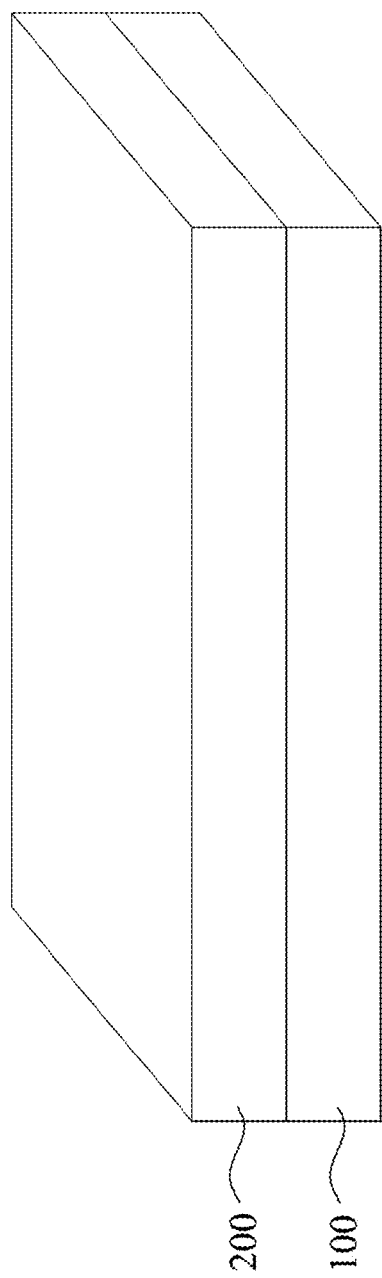
FIG. 1 to FIG. 5 schematically depict a perspective view of a process flow of forming a pattern in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

The present disclosure is directed to a method of forming a pattern. More specifically, the present disclosure is directed to a method of forming a pattern and avoiding edge defects such as indistinct appearance or absence of a portion of the pattern in the edge without processing OPC.

FIG. 1 to FIG. 5 schematically depict a perspective view of a process flow of forming a pattern in accordance with some embodiments of the present disclosure. FIG. 6 schematically depicts a top view of an alignment mark formed by the method in accordance with some embodiments of the present disclosure.

At first, please refer to FIG. 1, a structure including a substrate 100 and a target layer 200 is provided, in which the target layer 200 is disposed on the substrate 100 including a central area CA and a periphery area PA. In some embodiments, a material of substrate 100 is different to a material of the target layer 200. In some embodiments, the substrate 100 includes silicon (Si), gallium (Ga), gallium arsenide (GaAs), gallium nitride (GaN), strained silicon, silicon-germanium (SiGe), silicon carbide (SiC), diamond, epitaxy layer or the combination thereof. In some embodiments, the target layer 200 includes materials that are selected based on the types of devices to be formed. Examples of the target layer 200 materials include, for example but not limited to, dielectric materials (such as SiN), semiconductive materials, and conductive materials. In some embodiments, the structure further includes a hard mask between the substrate 100 and the target layer 200, in which the hard mask includes a monolayer or multi-layered structure.

Figure 2:
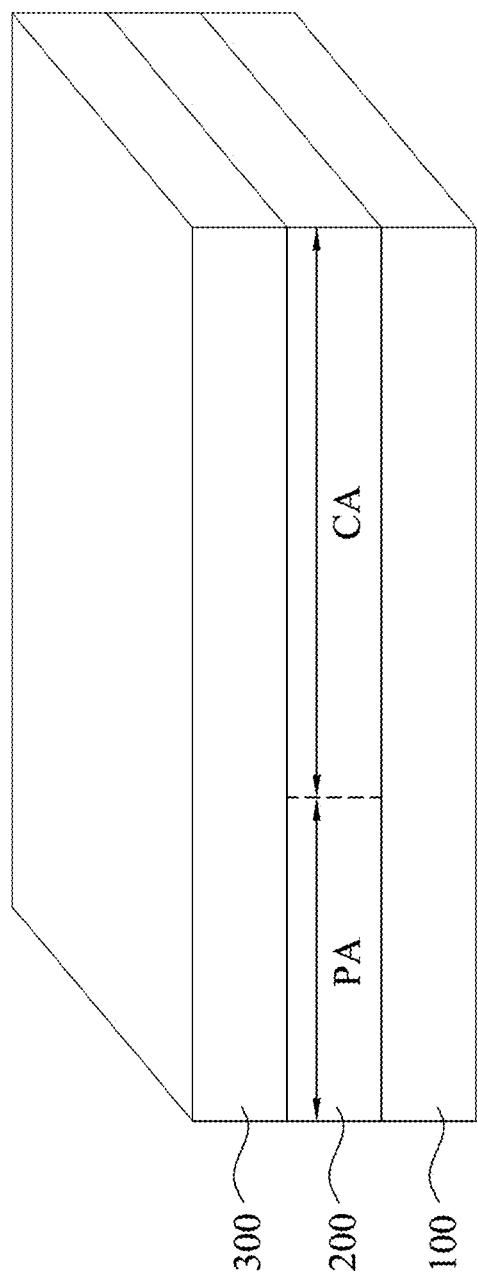

Next, refer to FIG. 2, a mask layer 300 is formed on the target layer 200, such as on the whole target layer 200 or on the central area CA of the target layer 200. In some embodiments, materials of a mask layer 300 include oxides, such as SiO.

Figure 3:
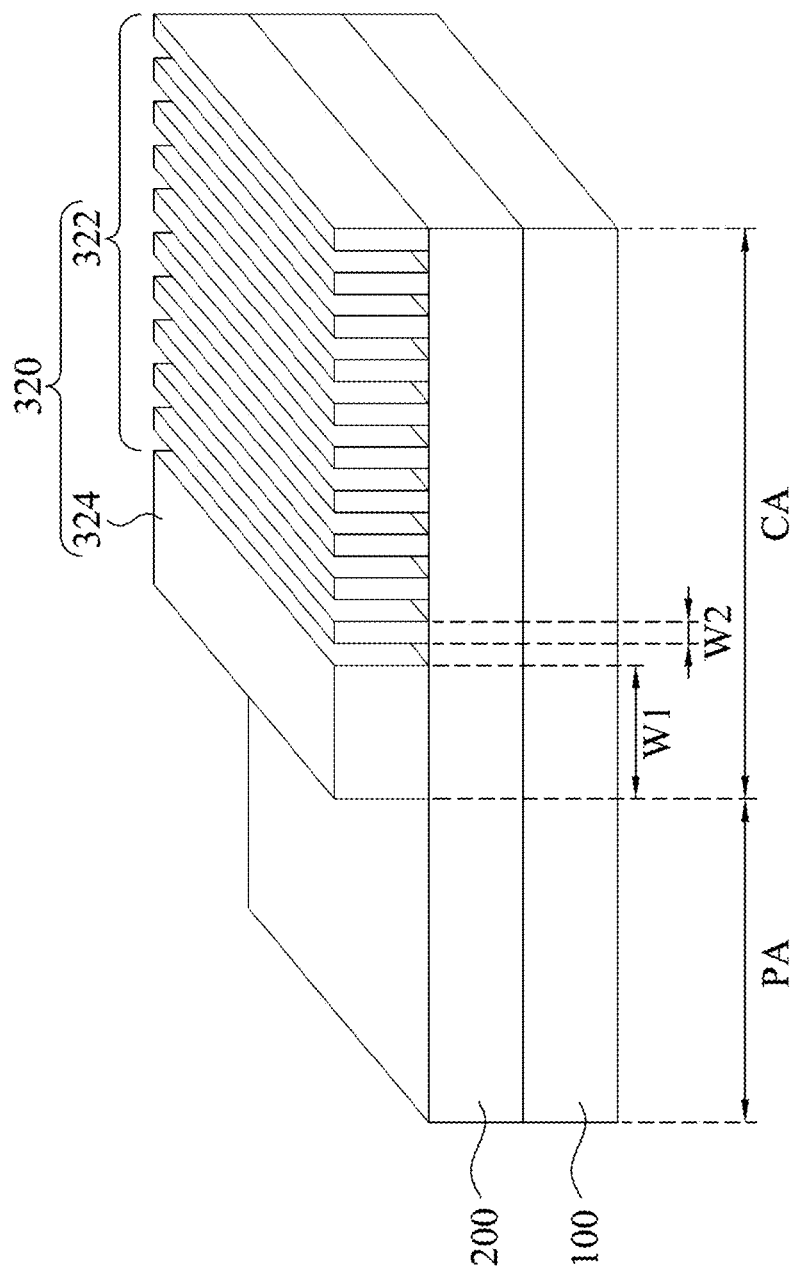

Refer to FIG. 3, the mask layer 300 is patterned to form a patterned mask layer 320, and a plurality of core patterns 322 and a linear spacer pattern 324 are formed on the central area CA, in which the linear spacer pattern 324 is located on the edge of the central area CA and spaced apart from the plurality of core patterns 322 by a gap. In other words, the linear spacer pattern 324 is adjacent to the plurality of core patterns 322. In some embodiments, the plurality of core patterns 322 are multiple linear patterns parallel to each other; for example, the multiple linear patterns are composed of the same linear pattern with a second width W2. The feature of the core patterns 322 can be adjusted based on the manufacture requirements. In some embodiments, the linear spacer pattern 324 may be one linear pattern with the first width W1. In some embodiments, the linear spacer pattern 324 may be replaced by multiple linear patterns parallel to each other, and one of the linear patterns adjacent to the core patterns 322 is spaced apart from the plurality of core patterns 322 by a gap; for example, the multiple linear patterns are composed of the same linear pattern with the first width W1. The feature of the linear spacer pattern 324 can be adjusted based on the manufacture requirements. In some embodiments, multiple linear spacer patterns 324 may be respectively formed on multiple sides adjacent to the plurality of core patterns 322, such as on two sides adjacent to the plurality of core patterns 322, or around the plurality of core patterns 322. The feature of the linear spacer pattern 324 can be adjusted based on the manufacture requirements. In some embodiments, the step of forming the plurality of core patterns 322 and the linear spacer pattern 324 on the central area CA can be performed by a first litho-etch process. The first litho-etch process includes disposing the mask layer 300 on the target layer 200, forming a first patterned photoresist on the mask layer 300, followed by etching the mask layer 300 not covered by the first patterned photoresist to form the plurality of core patterns 322 and the linear spacer pattern 324 on the central area CA, and then removing the first patterned photoresist. The first patterned photoresist can include lines formed by performing, for example but not limited to, conventional photolithography, as is known in the art of semiconductor manufacturing.

Figure 4:
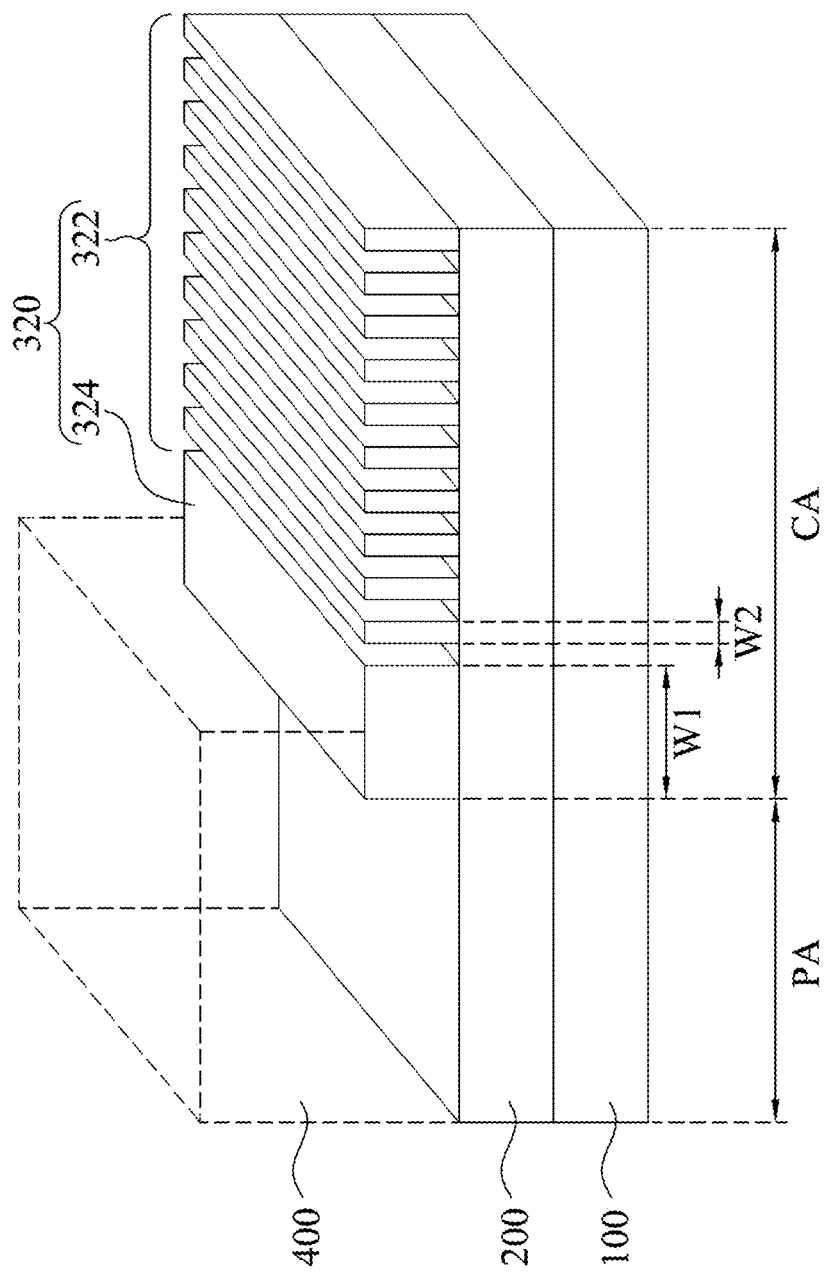

Refer to FIG. 4, a photoresist 400 is provided and covered on the periphery area PA. In some embodiments, the photoresist 400 may also be covered on a portion of the linear spacer pattern 324 adjacent to the periphery area PA due to the fluidity of the photoresist 400. That is, the higher fluidity the photoresist 400 is, the wider area of the linear spacer pattern 324 the photoresist 400 may be covered on. In one embodiment, the first width W1 is from 50 nm to 150 nm. It is worth noting that the linear spacer pattern 324 serves as a barrier to prevent the photoresist 400 from over-flowing out of the linear spacer pattern 324 and covering a portion of the plurality of core patterns 322 adjacent to the linear spacer pattern 324. The barrier efficacy of the linear spacer pattern 324 performs better while the first width W1 is enlarged to be wider than 50 nm; otherwise, the photoresist 400 can possibly cover the plurality of core patterns 322, further causing edge defects of the pattern in the central area CA formed by the following etching process. In one embodiment, the first width W1 can be adjusted according to the practical demands, in which the first width W1 can be less than 150 nm for saving the work space of the device (such as an array area). In one embodiment, the first width W1 is from 50 nm to 150 nm, such as 50 nm, 60 nm, 70 nm, 80 nm, 90 nm, 100 nm, 110 nm, 120 nm, 130 nm, 140 nm, 150 nm, or any values between the abovementioned numbers.

Figure 5:
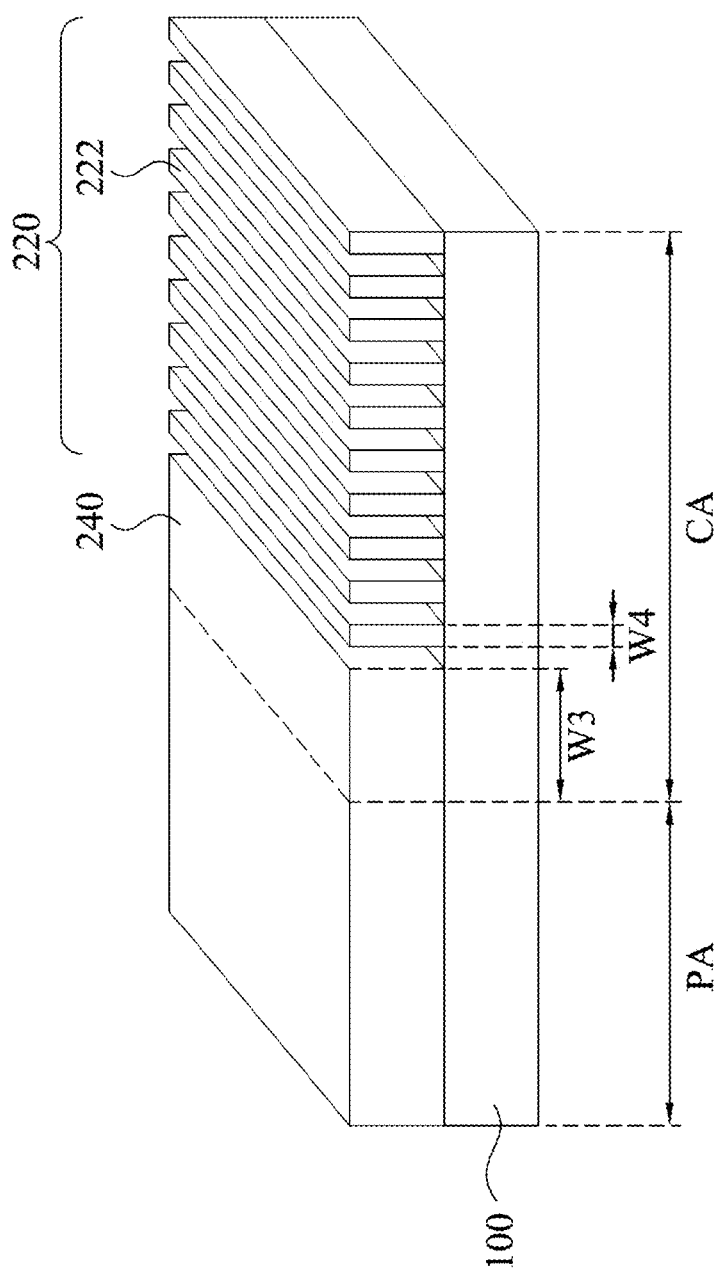
Figure 6:
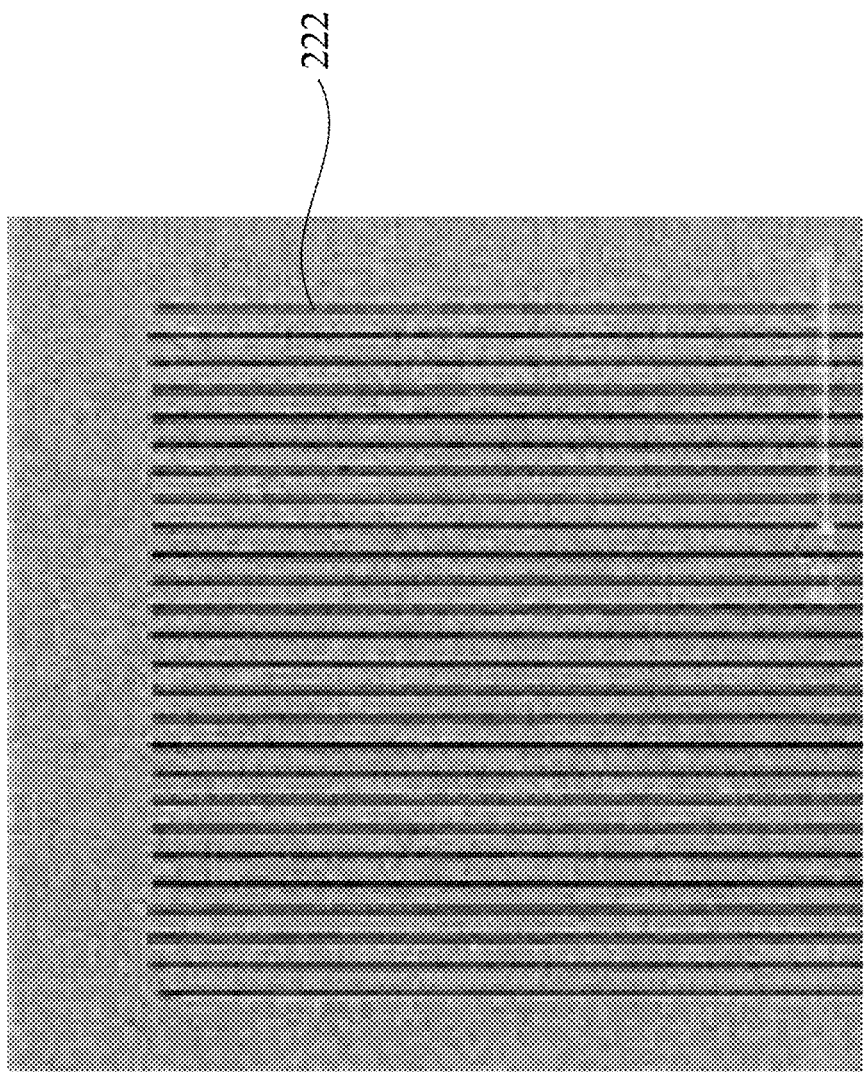
FIG. 6 schematically depicts a top view of an alignment mark formed by the method in accordance with some embodiments of the present disclosure.

Refer to FIGS. 5 and 6, a portion of the central area CA not covered by the plurality of core patterns 322 and not covered by the linear spacer pattern 324 is removed to form a pattern 220 without edge defects in the central area CA using the linear spacer pattern 324 and the plurality of core patterns 322 as etching masks. Next, the photoresist 400, the linear spacer pattern 324 and the plurality of core patterns 322 are removed to expose the pattern 220. After the patterning process of the target layer 200, the central area CA includes a spacer feature 240 and the pattern 220 containing a plurality of core features 222, in which a third width W3 of the spacer feature 240 and a fourth width W4 of the plurality of core features 222 are correlated to the width of the respective patterns of the patterned mask layer 320, the first width W1 and the second width W2. In some embodiments, the step of removing the portion of the central area CA not covered by the plurality of core patterns 322 and not covered by the linear spacer pattern 324 includes performing a second litho-etch process to form the pattern 220 in the central area CA. The second litho-etch process can be conducted by the process similar to the first litho-etch process. In some embodiments, the step of removing the photoresist 400, the linear spacer pattern 324 and the plurality of core patterns 322 includes performing an etching process (such as wet-etching or dry-etching) to remove the linear spacer pattern 324 and the plurality of core patterns 322. In some embodiments, the pattern 220 is an array pattern or an alignment mark.

In some embodiments of the present disclosure, a method of forming an alignment mark is also provided, including the steps of providing a structure including a substrate and a target layer, in which the target layer is disposed on the substrate, and the target layer includes a central area and a periphery area; forming a plurality of core patterns and a linear spacer pattern on the central area, in which the linear spacer pattern is spaced apart from the plurality of core patterns by a gap, and a width of the linear spacer pattern is wider than 50 nm; covering a photoresist on the periphery area; removing a portion of the central area not covered by the plurality of core patterns and not covered by the linear spacer pattern to form an alignment mark in the central area, and removing the photoresist, the linear spacer pattern and the plurality of core patterns to expose the alignment mark.

In summary, the present disclosure provides a method of forming a pattern, in which edge defects based on OPE are avoided by enlarging the width of the photoresist barrier for purpose of blocking the over-flow of the photoresist. According to the present disclosure, the higher quality of the semiconductor devices, with the higher accurate patterns without edge defects, can be achieved by the simplified manufacture procedure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming a pattern, comprising the steps of:
   providing a structure including a substrate and a target layer, wherein the target layer is disposed on the substrate, and the target layer includes a central area and a periphery area;
   forming a plurality of core patterns and a linear spacer pattern on the central area, wherein the linear spacer pattern is spaced apart from the plurality of core patterns by a gap, wherein a width of the linear spacer pattern is wider than 50 nm;
   covering the periphery area and a first portion of the linear spacer pattern on the central area with a photoresist, wherein a second portion of the linear spacer pattern on the central area is free from coverage by the photoresist, the photoresist has a fluidity, and the linear spacer pattern prevents the photoresist from covering a portion of the plurality of core patterns;
   removing a portion of the central area not covered by the plurality of core patterns and not covered by the linear spacer pattern to form a pattern in the central area; and
   removing the photoresist, the linear spacer pattern and the plurality of core patterns to expose the pattern.

2. The method of claim 1, wherein the structure further includes a hard mask between the substrate and the target layer.

3. The method of claim 1, wherein the target layer includes SiN.

4. The method of claim 1, wherein the width of the linear spacer pattern is from 50 nm to 150 nm.

5. The method of claim 1, wherein materials of the plurality of core patterns and the linear spacer pattern include oxides.

6. The method of claim 1, wherein the step of forming the plurality of core patterns and the linear spacer pattern on the central area includes:
   disposing a mask layer on the target layer;
   forming a first patterned photoresist on the mask layer;
   etching the mask layer not covered by the first patterned photoresist to form the plurality of core patterns and the linear spacer pattern on the central area; and
   removing the first patterned photoresist.

7. The method of claim 1, wherein the step of forming the plurality of core patterns and the linear spacer pattern on the central area includes forming a plurality of linear spacer patterns on the central area.

8. The method of claim 1, wherein the step of removing the portion of the central area not covered by the plurality of core patterns and not covered by the linear spacer pattern includes performing a second litho-etch process to form the pattern in the central area.

9. The method of claim 1, wherein the step of removing the photoresist, the linear spacer pattern and the plurality of core patterns includes performing an etching process to remove the linear spacer pattern and the plurality of core patterns.

10. The method of claim 1, wherein the pattern is an array pattern or an alignment mark.

11. A method of forming an alignment mark, comprising the steps of:
    providing a structure including a substrate and a target layer, wherein the target layer is disposed on the substrate, and the target layer includes a central area and a periphery area;
    forming a plurality of core patterns and a linear spacer pattern on the central area, wherein the linear spacer pattern is spaced apart from the plurality of core patterns by a gap, wherein a width of the linear spacer pattern is wider than 50 nm;
    covering the periphery area and a first portion of the linear spacer pattern on the central area with a photoresist, wherein a second portion of the linear spacer pattern on the central area is free from coverage by the photoresist, the photoresist has a fluidity, and the linear spacer pattern prevents the photoresist from covering a portion of the plurality of core patterns;
    removing a portion of the central area not covered by the plurality of core patterns and not covered by the linear spacer pattern to form an alignment mark in the central area; and
    removing the photoresist, the linear spacer pattern and the plurality of core patterns to expose the alignment mark.

* * * * *